United States Patent
Aley et al.

(10) Patent No.: US 10,698,051 B2
(45) Date of Patent: Jun. 30, 2020

(54) METHODS FOR ADJUSTING A MAGNETIC FIELD OF A MAGNETIC RESONANCE TOMOGRAPHY DEVICE, MAGNETIC POWER SUPPLIES, AND MAGNETIC RESONANCE TOMOGRAPHY DEVICES

(71) Applicant: Siemens Healthcare GmbH, Erlangen (DE)

(72) Inventors: Nicholas Aley, Erlangen (DE); Stephan Biber, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 16/149,248

(22) Filed: Oct. 2, 2018

(65) Prior Publication Data
US 2019/0107591 A1 Apr. 11, 2019

(30) Foreign Application Priority Data
Oct. 6, 2017 (EP) .................................. 17195210

(51) Int. Cl.
*G01R 33/421* (2006.01)
*G01R 33/3815* (2006.01)
(Continued)

(52) U.S. Cl.
CPC ......... *G01R 33/421* (2013.01); *G01R 33/381* (2013.01); *G01R 33/3815* (2013.01); *H01F 6/006* (2013.01)

(58) Field of Classification Search
CPC ................ G01R 33/421; G01R 33/381; G01R 33/3815; G01R 33/543; G01R 33/389
(Continued)

(56) References Cited

U.S. PATENT DOCUMENTS 6,150,912 A * 11/2000 Elgin, II ............ G01R 33/3815
335/216
8,729,894 B2 * 5/2014 Hollis ........................ H01F 6/02
324/307
(Continued)

FOREIGN PATENT DOCUMENTS

WO WO2014199793 A1 12/2014
WO WO2016106037 A1 6/2016

OTHER PUBLICATIONS

Mulkern, R.V., Panych, L.P., Hynynen, K., Jolesz, F.A. And McDannold, N.J., 1998. Tissue temperature monitoring with multiple gradient-echo imaging sequences. Journal of Magnetic Resonance Imaging, 8(2), pp. 493-502. (Year: 1998).*
(Continued)

Primary Examiner — Christopher P McAndrew
(74) Attorney, Agent, or Firm — Lempia Summerfield Katz LLC (57) ABSTRACT

A method for adjusting a magnetic field of a magnetic resonance tomography (MRT)-device having a magnet includes: transferring the magnet from an operating state to a non-operating state in a ramp-down mode; subsequently transferring the magnet from the non-operating state to the operating state in a ramp-up mode; observing a reference parameter different from the magnetic field; setting a target value for the reference parameter; comparing the observed reference parameter to the target value; and finishing the ramp-up mode when the reference parameter reaches the target value.

20 Claims, 5 Drawing Sheets

(51) Int. Cl.
*G01R 33/381* (2006.01)
*H01F 6/00* (2006.01)

(58) Field of Classification Search
USPC .......................................................... 324/309
See application file for complete search history.

(56) References Cited

U.S. PATENT DOCUMENTS

| | | | | |
|---|---|---|---|---|
| 2005/0111159 A1* | 5/2005 | Knight | ............... | G01R 33/3815 |
| | | | | 361/143 |
| 2006/0284711 A1* | 12/2006 | Atkins | ............... | G01R 33/3815 |
| | | | | 335/216 |
| 2008/0074110 A1* | 3/2008 | Mito | ................... | G01R 33/0356 |
| | | | | 324/248 |
| 2015/0255977 A1* | 9/2015 | Jonas | ................. | G01R 33/3815 |
| | | | | 361/19 |

OTHER PUBLICATIONS

Bottura, L. et al. "Field Measurements" CERN Accelerator School, Erice, CERN report, pp. 1-34, (2008).
European Search Report for corresponding Application No. 17195210.4-1022, dated May 17, 2018.

* cited by examiner

METHODS FOR ADJUSTING A MAGNETIC FIELD OF A MAGNETIC RESONANCE TOMOGRAPHY DEVICE, MAGNETIC POWER SUPPLIES, AND MAGNETIC RESONANCE TOMOGRAPHY DEVICES

The application claims the benefit of European Patent Application No. EP 17195210.4, filed Oct. 6, 2017, which is hereby incorporated by reference in its entirety.

TECHNICAL FIELD

The present disclosure describes a method for adjusting a magnetic field of a magnetic resonance tomography (MRT) device, using a magnetic power supply and a magnetic resonance tomography (MRT) device.

BACKGROUND

Magnetic resonance tomography (MRT) devices are well known in the state of the art. An element of a MRT device is a magnet defining, by its magnetic field, a center frequency for the radiation emitted by a patient or a probe being located in the MRT, wherein the radiation is emitted after an excitation by a high frequency pulse. Corresponding to the center frequency, a receiving coil of the MRT-device is configured to receive the emitted radiation.

For superconducting magnets, one cryogenic solution is to cool the magnet in a Helium bath where the magnet coils are enclosed in vessel in direct contact with liquid Helium. Most systems use around 1000-2000 liquid liters of Helium, which adds cost due to the complexity of managing the Helium inventory. One of the current trends for superconducting magnets is to dramatically reduce (e.g., Low Helium Inventory—LHI) or remove the Helium system (e.g., Dry Magnet) from the magnet. This has already been seen on small magnets used for NMR and animal MRI. Removing the Helium system presents many technical challenges and practical challenges of having such a magnet operate in a real hospital or clinic environment. In particular, for "LHI and dry magnets", where there is a probability for a breakdown of the site electric power supply and/or a breakdown of a cooling supply for the magnet refrigeration system, there is the risk of a "quench" where the magnet coils become resistive leading to a rapid reduction of field and warming of the magnet, leading to a lengthy recovery time and customer downtime. To reduce the downtime of the MR system for the customer, the MRT-device may be run-down to zero field in such scenarios, in particular, by using a ramp-down mode transferring the magnet from an operating status into a non-operating status but avoiding the lengthy recovery time after a quench. Once the magnet refrigeration has been restored, the magnet is transferred from the non-operating state to the operating state by re-cooling the magnet and re-ramping the magnet to field. However, this reestablishing of the magnetic field might result in a shift of the magnetic field established at the end of the ramp-up mode compared to the previous realized magnetic field. A resulting mismatch between the center frequency of the emitted radiation and a center frequency of the receiving coil causes a reduction of a transmission performance of the MRT-device.

PCT Publication No. WO 2014/199793 A1 describes a method for restarting a magnet of a MRT during an operation of a refrigerator. In particular, it is provided to increase a current of a superconducting coil until the current value reaches the current value in a state of a previous operation of the coil.

U.S. Patent Application Publication No. 2005/0111159 A1 concerns another technique for placing superconducting magnets into operation. For example, the technique provides for automatically controlling ramp-up of a superconducting magnet. In one aspect, the technique includes connecting a power supply to the magnet, determining constraining parameters of the ramp-up automatically, applying power to the magnet, automatically controlling the ramp-up based on the constraining parameters, and wherein the ramp-up is complete upon reaching a predetermined value of a target parameter.

SUMMARY AND DESCRIPTION

The scope of the present disclosure is defined solely by the appended claims and is not affected to any degree by the statements within this description. The present embodiments may obviate one or more of the drawbacks or limitations in the related art.

It is an object of the present disclosure to adjust the magnetic field of a MRT-device accurately after a ramp-down mode, in particular, in a cost efficient and easy way.

This object is achieved by a method for adjusting a magnetic field of a magnetic resonance, by a magnetic power supply, and by a magnetic resonance tomography (MRT) device as disclosed herein.

According to a first aspect, a method is provided for adjusting a magnetic field of a magnetic resonance tomography (MRT)-device having a magnet. The method includes: transferring the magnet from an operating state to a non-operating state in a ramp-down mode; subsequently transferring the magnet from the non-operating state to the operating state in a ramp-up mode; observing a reference parameter different from the magnetic field; setting a target value for the reference parameter; comparing the observed reference parameter to the target value; and finishing the ramp-up mode, when the reference parameter reaches the target value.

In contrast to the state of the art, the magnetic field of the MRT-device is re-established by observing the reference parameter, which is different from the magnetic field, and by comparing the observed reference parameter to the target value for determining the end of the ramp-up mode. In other words, the magnetic field is not measured directly and thus complex measuring systems for observing the magnetic field may be avoided. Additionally, it is possible to adjust the magnetic field accurately for establishing a desired center frequency matching to the center frequency of the receiving coil. Thereby the desired magnetic field is re-established at the end of the ramp-up mode. In particular, a control unit is provided for: comparing the observed reference parameter to the target value; and finishing the ramp-up mode for re-establishing the desired magnetic field. The reference parameter and the target value may be compared continuously during the ramp-up mode.

In particular, in a ramp-up mode, a current causing the magnetic field is successively increased for realizing the magnetic field and in the ramp-down mode the current is reduced. Thereby, the current is provided by a magnetic power supply. Moreover, the methods refer to a ramp-up mode being initiated after a previous ramp-down mode, e.g., after a previous shut down, (such as for safety reasons, for maintenance work, or for recovering a malfunction of the MRT-device). The phrase "observing reference parameter different from the magnetic field" is generic for measuring without a device being intended for measuring the magnetic field directly such as a flux meter, AC-Hall-sensor, a DC-Hall-sensor, a SQUID sensor, or a fluxgate. Instead, a different parameter is observer or measured. In certain examples, the reference parameter is only observed during the ramp-up-mode or during a defined time span of the ramp-up mode.

According to an embodiment, the reference parameter is a current, in particular, a current for realizing the magnetic field of the magnet. Measuring the current that realizes the magnetic field may be established, for example, by integrating a shunt into the magnetic power supply. Furthermore, the current being observed during the ramp-up mode is observed anyway. Thus, there is no need for integration a new measuring device into the MRT-device.

For setting the target value, the current may be calibrated during a previous ramp-up mode, for example, the preceding ramp-up mode. In particular, in a calibration mode the MRT-device is operated in a ramp-up mode and simultaneously the center frequency and the current are measured. As soon as the desired center frequency of the receiving coil is reached, the corresponding current is measured and saved to a memory device as a target value. By relying on the saved target value, the control unit compares the actual reference parameter measured in a subsequent ramp-up mode to the target value saved in the memory device. It is possible that the previous ramp-up mode being in charge of the calibration takes place during the installation or during maintenance work.

In an embodiment for setting the target value, the current is calibrated during a previous ramp-down mode, in particular, during the ramp-down mode preceding the ramp-up mode. As a consequence, the calibration is performed at a time being close to the ramp-up mode. This allows reducing the accuracy, repeatability, and reproduction specifications of the current measuring device at the magnetic power supply. Thus, a shunt may be used as a current measuring device instead of comparable expensive current transducers being more accurate and stable. In particular, integrating such a shunt into the magnetic power supply provides a greater flexibility regarding the locating of the magnetic power supply, because the shunt is not as sensitive to magnetic stray fields as a current transducer. Furthermore, requirements for the MRT-device to monitor and to store the calibration of the current measuring device are not needed in this embodiment. Thus, more complex procedures involving regular service or a customer involvement may be avoided.

In certain examples for setting the target value, the current is observed during an initiation phase of the ramp-down mode. In particular, the current is measured immediately before the ramp-down mode is started, e.g., before the current is reduced. As a result, the current value being the last known current value for realizing the desired magnet field is set as target value. This is a particular easy way of setting the target value. Another advantage of calibrating the target value in the initiation phase is that there is no need for a further probe that has to be placed into the MRT-device.

In another embodiment, the current is measured by a current measuring device included into a magnetic power supply of the MRT-device. By integrating the current measuring device into the magnetic power supply, it is further advantageously possible to reduce a cabling effort as well as shielding effort for shielding the current measuring device. As a consequence, additional costs regarding the cabling and shielding may be avoided.

According to another embodiment, the ramp-down mode is an emergency ramp-down mode. Thus, the calibration, e.g., setting the target value, is incorporated into the emergency ramp-down. The current may be measured as soon as the emergency ramp-down is initiated. Thus, the reduction of the current may start as soon as possible.

In another embodiment, the reference parameter is a frequency, in particular, a frequency emitted by a phantom being placed into the MRT-device. As soon as the emitted frequency reaches the center frequency of the receiving coil, the ramp-up is stopped. In this scenario, the target value corresponds to the center frequency of the receiving coil. Thus, only a phantom or a probe needs to be located into the MRT-device. The ramp-mode may be interrupted and establish a magnetic field lower than the desired magnetic field. Subsequently, the phantom is located in the MRT-device and the ramp-mode is continued. As a consequence, the beginning of the ramp-mode may be performed without a phantom, for example, in a unattended state of the MRT-device such as overnight.

In particular, the phantom, (e.g., a PTAB phantom), is placed, (e.g., automatically placed), into the MRT-device before the ramp-up mode starts or during the ramp-up mode. By automatically placing the phantom, it is guaranteed that the position of the phantom is repeatable and there is no interference by an operator necessary.

According to another embodiment, the target set is reset after a predefined period of time, in particular, automatically. As a consequence, the target value is refreshed from time to time taking into account an aging of the current measuring device, for instance.

In another embodiment, the ramp-down mode is initiated by a control unit by: a failure message 51 of the MRT-device (particularly with regard to any failure impacting the magnet refrigeration), after a defined time sequence, and/or as a result of an activation 52. Thus, the MRT-device may be switched off for safety reasons, for recovering functionalities of the MRT-device, or for saving energy.

A magnetic field in the operating state may be less than 1.5 T, less than 1.0 T, or less than 0.5 T. Those magnetic fields correspond to low field systems being more sensitive to deviations from the center frequency than systems having magnetic fields greater than 1.5 T. Therefore, the adjusting of the magnetic field according to the present method has a particularly positive effect for MRT-devices having magnetic fields being less than 1.5 T.

Another aspect is a magnetic power supply being configured for transferring the magnet from an operating state to a non-operating state in a ramp down mode; subsequently transferring the magnet from the non-operating state to the operating state in a ramp-up mode; observing a reference parameter; setting a target value for the reference parameter; comparing the observed reference parameter to the target value; and finishing the ramp-up mode, when the reference parameter reaches a target value.

According to an embodiment, the magnetic power supply includes a current measuring device.

Another aspect is a magnetic resonance tomography (MRT)-device being configured for transferring the magnet from an operating state to a non-operating state in a ramp down mode; subsequently transferring the magnet from the non-operating state to the operating state in a ramp-up mode; observing a reference parameter; setting a target value for the reference parameter; comparing the observed reference parameter to the target value; and finishing the ramp-up mode when the reference parameter reaches a target value.

DETAILED DESCRIPTION

Figure 1:
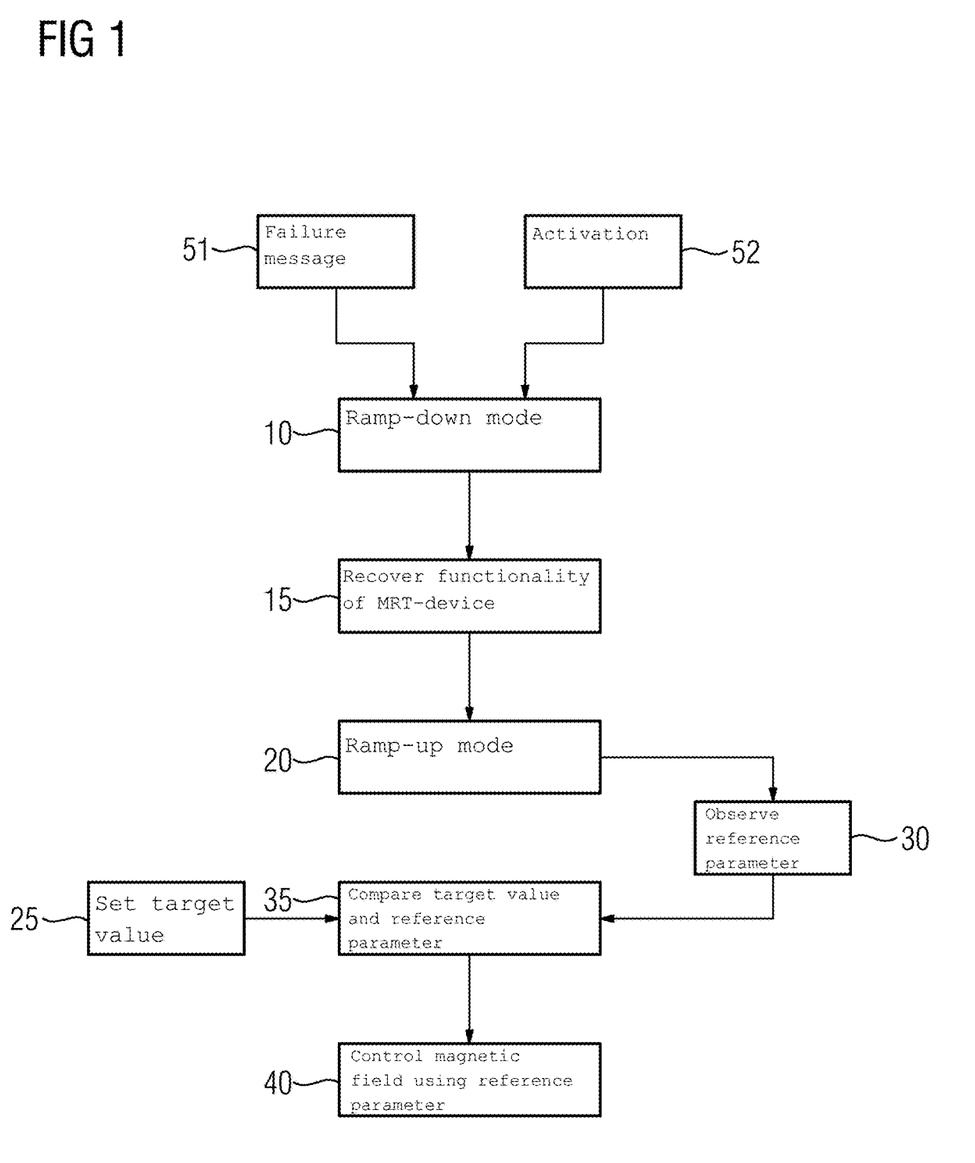
FIG. 1 depicts a flow diagram illustrating a method for adjusting a center frequency of a magnetic resonance tomography device according to a first embodiment.

In FIG. 1, a flow diagram illustrating a method for adjusting a center frequency of a magnetic resonance tomography (MRT)-device 1 according to a first embodiment is shown. An element of a magnetic MRT-device 1 is a magnetic field generated by a magnet 2 and a high frequency pulse. For recording a MRT-image, energy from an oscillating magnetic field temporarily is applied to a patient or a probe, such as a phantom, at an appropriate center frequency. As a consequence, excited hydrogen atoms emit a radio frequency signal, which is measured by a receiving coil. A high frequency amplifier may be provided for covering a frequency band surrounding the center frequency for taking into account a frequency shift caused by a thickness of the probe, (e.g., the patient), being measured. However, a transmission performance strongly depends on deviation of the emitted frequency from the desired center frequency being optimized for the receiving coil, in particular, in the case of magnetic fields being less than 1 T or 0.5 T, due to reflection effects. These reflection effects are, in particular, a result of a reduced conductivity of tissue, (e.g., human tissue), for low center frequencies that are assigned to small magnetic fields. As a result, at the receiving coil, losses caused by the patient are smaller and the reflection factor changes more strongly compared to system using higher magnetic fields. Another problem is the different reflection factors being respectively assigned to parts of the receiving coil and resulting in a reduced transmission performance.

Thus, a mismatch between the center frequency caused by the magnetic field and the center frequency of the receiving coil may be avoided. However, the magnetic field determining the center frequency decreases over time or is adjusted inaccurately by an automatic ramp-up mode 20 transferring the magnet from a non-operating state in an operating state. Such an automatic ramp-up mode 20 follows a ramp-down mode, which may be needed for "dry magnets" having a high probability for shutting down due to a malfunction of a cooling and/or due to a power failure. According to the embodiment shown in FIG. 1, the magnet field is re-established after a ramp-down mode 10 in the ramp-up mode 20 transferring the magnet from the non-operating state to the operating state. A functionality of the MRT-device such as a cooling mechanism or a current supply may be recovered 15 in the time between finishing the ramp-down mode 10 and starting 19 the ramp-up mode 20. For adjusting the proper magnetic field corresponding to the desired center frequency being optimized for the receiving coil observing 30 a reference parameter is provided, in particular, measured. Such a reference parameter might be a current or a frequency. Furthermore, setting 25 a target value for the reference parameter is provided. By comparing 35 the observed reference parameter to the target value, it is possible to finish the ramp-up mode 20, when the reference parameters corresponds to the target value. As a consequence, it is possible to control the magnetic field 40 by using the reference parameter instead of measuring the magnetic field directly. Thus, adjusting the magnetic field may be done without expansive devices for measuring the magnetic field.

Figure 2:
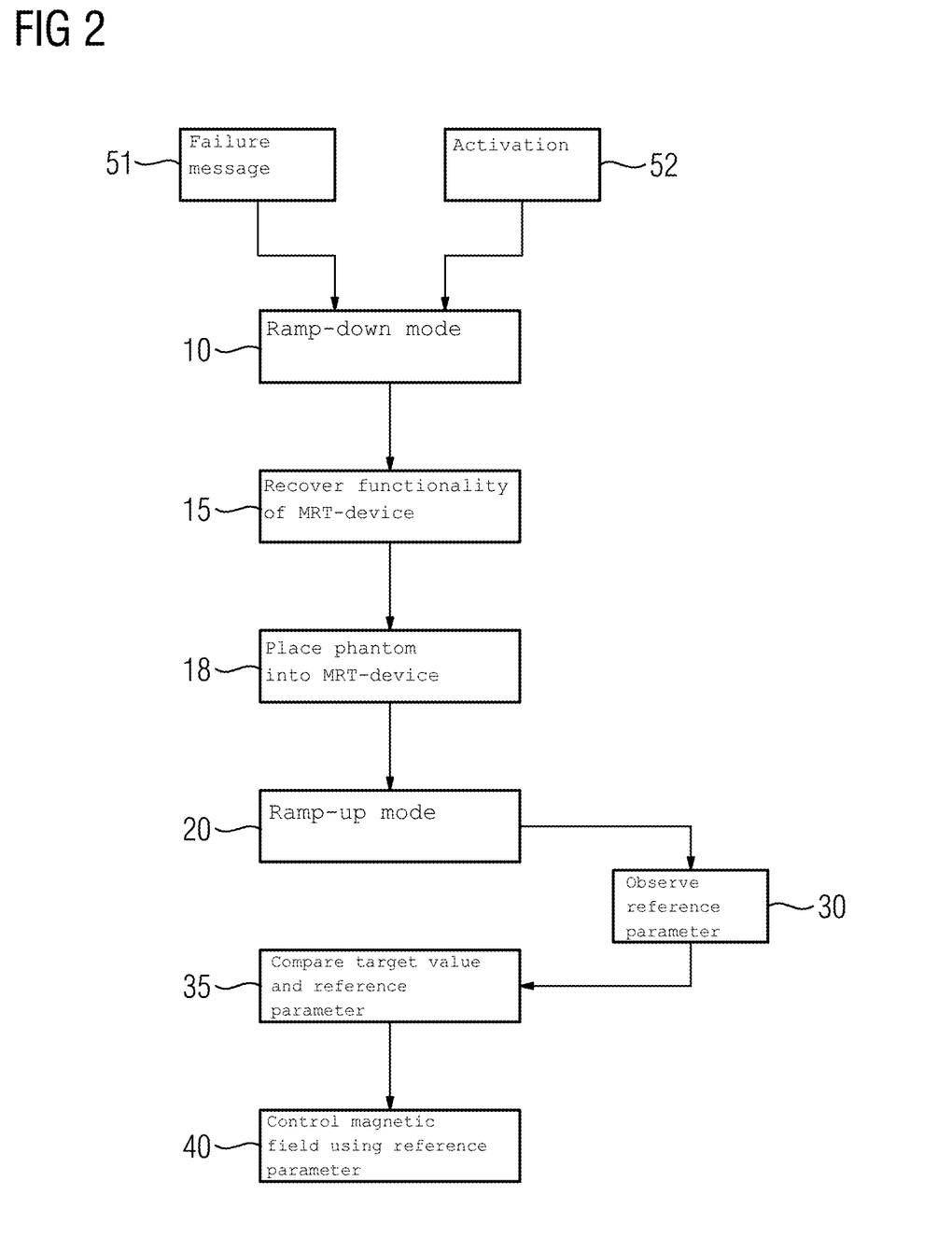
FIG. 2 depicts a flow diagram illustrating a method for adjusting a center frequency of a magnetic resonance tomography device according to a second embodiment.

In FIG. 2, a flow diagram illustrating a method for adjusting a center frequency of a magnetic resonance tomography device according to a second embodiment is shown. In the embodiment presented in FIG. 2, the reference parameter is a frequency, e.g., the frequency emitted by a phantom being exposed to the magnetic field and the high frequency pulse during the ramp-up mode 20. By comparing 35 the emitted frequency and the target value, (e.g., the center frequency assigned to the receiving coil), it is possible to finish the ramp-up when the measured frequency reaches the center frequency. Then, the desired magnet filed is established, in particular, re-established. For measuring the frequency of the radiation emitted by the phantom, the phantom is placed 18 into the MRT-device 1, (e.g., inside the magnet), before the ramp-up mode 20 is started or the ramp-down mode is finished. It is also conceivable that the phantom, (for example, a PTAB phantom), is placed automatically at the proper spot for the ramp-up mode 20 that is intended to adjust the desired magnet field. It is also conceivable that the ramp-up mode 20 starts and the observing 30 of the reference value starts when an approximated magnetic field below the target magnetic field is reached. Subsequently, the phantom is placed and the ramp-up mode 20 is continued, in particular, by incrementally increasing the magnetic field, until the phantom emits the center frequency. Thus, a part of the ramp-up mode 20 may be performed without a phantom, for example, during the night.

Figure 3:
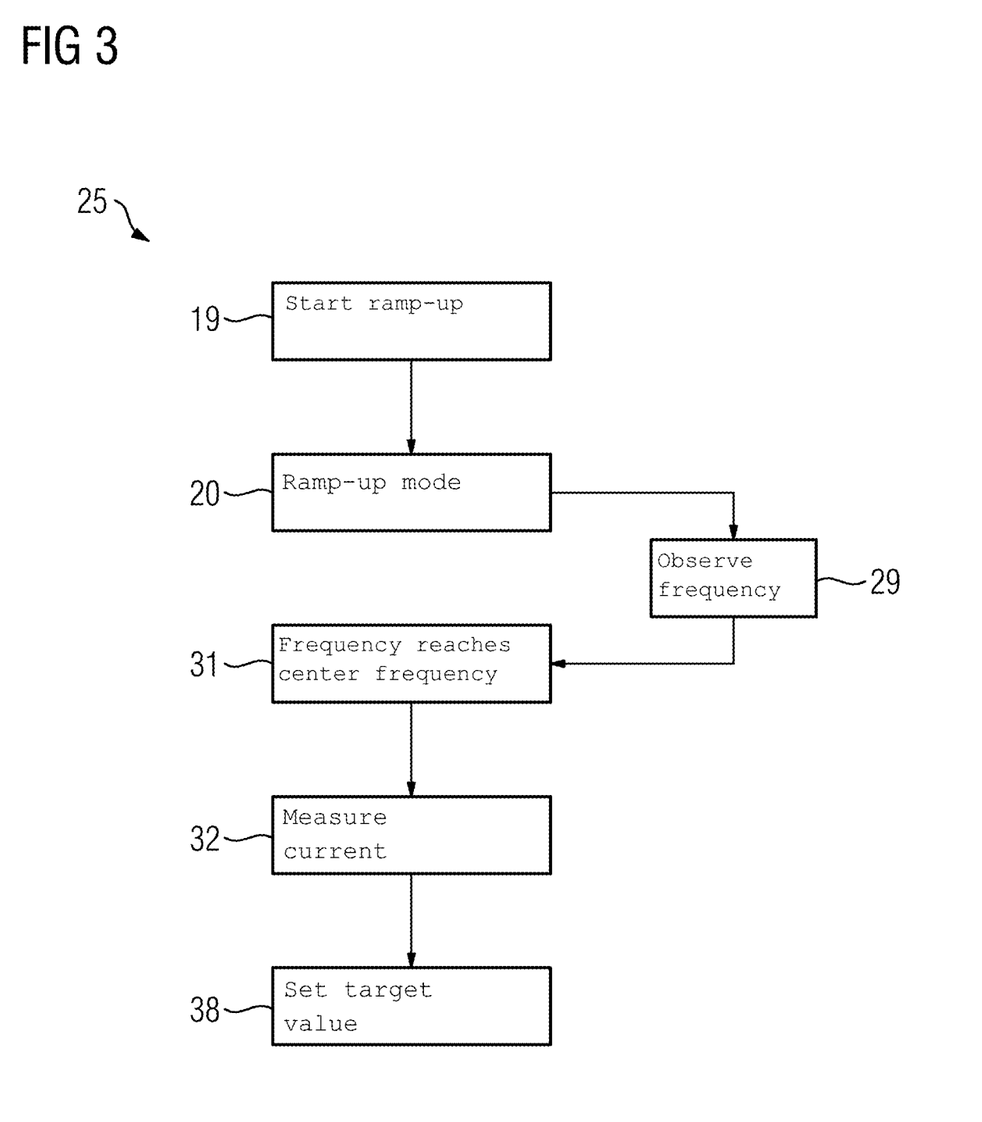
FIG. 3 depicts a flow diagram illustrating a method for adjusting a center frequency of a magnetic resonance tomography device according to a third embodiment.
Figure 5:
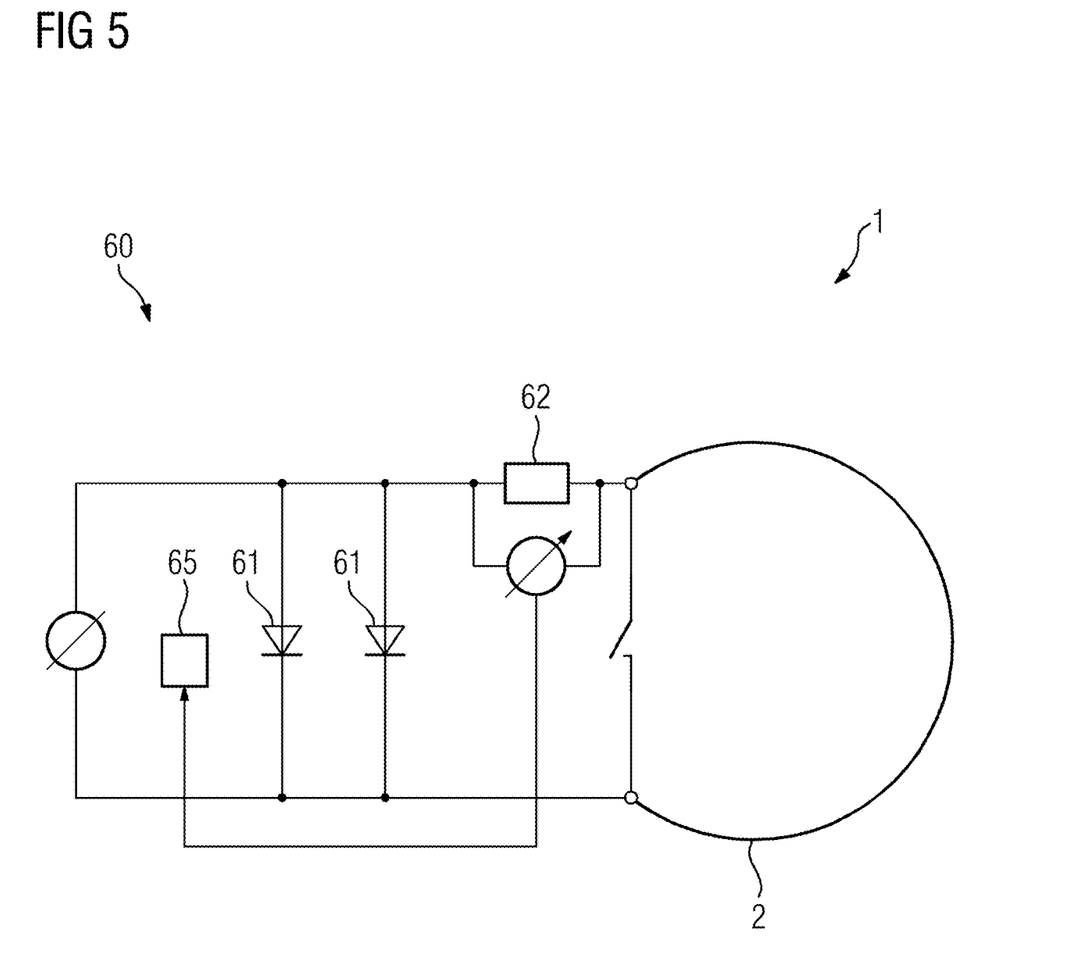
FIG. 5 depicts a flow diagram illustrating a method for adjusting a center frequency of a magnetic resonance tomography device according to a fourth embodiment.

In the embodiment presented in FIG. 3 or 5, the reference parameter is a current, in particular, the current used for establishing the desired magnet field. The current may be measured by a shunt 62 integrated to a magnetic power supply 60 providing the current for realizing the desired magnetic field. In this scenario, the target value corresponds to the current establishing the desired magnetic field and the ramp-up mode 20 is finished as soon as the target value, (e.g., the target current), is reached.

Figure 4:
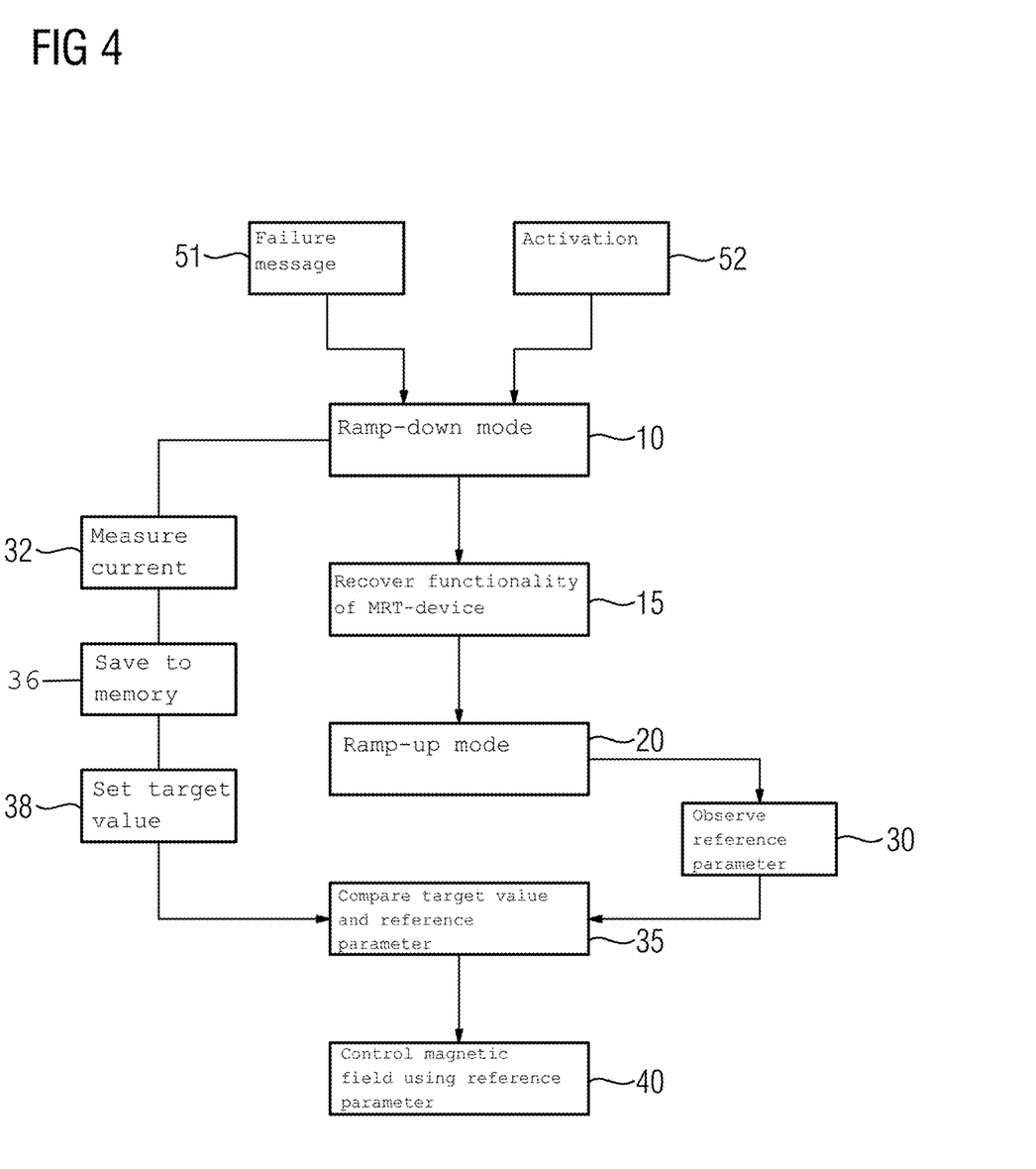
FIG. 4 depicts a flow diagram illustrating a setting of a target value according to an embodiment.

The method includes setting 25 the target value, for example, by a calibration process. In FIG. 4, setting 25 the target value by a calibration process or calibration mode during a ramp-up mode 20 or a ramp-down mode 10 is shown. For example, the setting 25 of the target value by the calibration process is performed during the installation of the MRT device or the target value is refreshed by repeating the calibration process after a determined set of time, for example, each sixth month. For calibrating, the frequency is observed 29 in a calibration mode. As soon as the frequency reaches 31 the desired center frequency, the current is measured 32 and saved to a memory device 36. The saved current value represents the set target value 38. By refreshing the target value, it is advantageously possible to take into account that the current measuring device ages. Thus, the center frequency is maintained at its optimum level.

In FIG. 5, a block diagram is shown illustrating a method for adjusting the magnetic field in a MRT-device 1 according to a fourth embodiment. Similar to the embodiment of FIG. 4, the reference parameter is the current, in particular, the current in a shunt 62 integrated to the magnetic power supply 62. In contrast to the embodiment of FIG. 4, the target value is set during an emergency ramp-down mode. In particular, the current is measured in the initial phase of the ramp-down-mode 10, e.g., before the current is decreased for shutting down the MRT-device. As a result, it is possible to re-establish the magnet field by using the last known current value that established the proper magnetic field before the emergency ramp down mode. Thus, in a simple and efficient way the magnetic field is reset accurately and complex procedures involving regular service visits or customer involvements, such as placing the phantom into the MRT-device, are avoided.

In FIG. 5, a circuit diagram for a MRT-device is schematically shown. In particular, the current for the magnet of the MRT device is provided by a magnetic power supply 60. Further, the circuit diagram includes diodes 61 being connected in parallel. For measuring the current used for establishing the magnet field of the magnet a shunt 62 is provided. The shunt may be integrated between the diodes 61 and the magnet 2. The observed current is transferred to a control unit 65. The control unit 65 may compare 35 the observed current to the target value saved in the memory and stops the ramp-up mode 20 of the magnetic power supply as soon as the target value is reached by the reference parameter.

Although the disclosure has been illustrated and described in detail by the exemplary embodiments, the disclosure is not restricted by the disclosed examples and the person skilled in the art may derive other variations from this without departing from the scope of protection of the disclosure. It is therefore intended that the foregoing description be regarded as illustrative rather than limiting, and that it be understood that all equivalents and/or combinations of embodiments are intended to be included in this description.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

The invention claimed is:

1. A method for adjusting a magnetic field of a magnetic resonance tomography (MRT)-device having a magnet, the method comprising:
transferring the magnet from an operating state to a non-operating state in a ramp-down mode;
subsequently transferring the magnet from the non-operating state to the operating state in a ramp-up mode;
observing a reference parameter different from the magnetic field, wherein the reference parameter comprises a current;
setting a target value for the reference parameter, wherein the current is calibrated during a previous ramp-up mode, a previous ramp-down mode, or a combination thereof;
comparing the observed reference parameter to the target value; and
finishing the ramp-up mode when the reference parameter reaches the target value.

2. The method of claim 1, wherein the current is for realizing the magnetic field of the magnet.

3. The method of claim 1, wherein, in the setting of the target value, the current is calibrated during the previous ramp-up mode.

4. The method of claim 3, wherein the previous ramp-up mode is a preceding ramp-up mode.

5. The method of claim 1, wherein, in the setting of the target value, the current is calibrated during the previous ramp-down mode.

6. The method of claim 5, wherein the previous ramp-down mode is a preceding ramp-down mode.

7. The method of claim 5, wherein, in the setting of the target value, the current is observed during an initiation phase of the ramp-down mode.

8. The method of claim 1, wherein the current is measured by a current measuring device included into a magnetic power supply of the MRT-device.

9. The method of claim 5, wherein the ramp-down mode is an emergency ramp-down mode.

10. The method of claim 1, wherein the reference parameter further comprises a frequency.

11. The method of claim 10, wherein the frequency is a frequency emitted by a phantom being placed into the MRT-device.

12. The method of claim 11, wherein the phantom is placed into the MRT-device before the ramp-up mode starts or during the ramp-up mode.

13. The method of claim 11, wherein the phantom is automatically placed into the MRT-device before the ramp-up mode starts or during the ramp-up mode.

14. The method of claim 1, wherein the target value is reset after a predefined period of time.

15. The method of claim 1, wherein the target value is automatically reset after a predefined period of time.

16. The method of claim 1, wherein the ramp-down mode is initiated by a control unit by a failure message of the MRT-device, after a defined time sequence, as a result of a activation, or a combination thereof.

17. The method of claim 1, wherein a magnetic field in the operating state is less than 1.5 T.

18. A magnetic power supply configured to:
transfer a magnet from an operating state to a non-operating state in a ramp down mode;
subsequently transfer the magnet from the non-operating state to the operating state in a ramp-up mode;
observe a reference parameter, wherein the reference parameter comprises a current;
set a target value for the reference parameter, wherein the current is calibrated during a previous ramp-up mode, a previous ramp-down mode, or a combination thereof;
compare the observed reference parameter to the target value; and
finish the ramp-up mode when the reference parameter reaches a target value.

19. The magnetic power supply of claim 18, wherein the magnetic power supply comprises a current measuring device configured to observe the current.

20. A magnetic resonance tomography (MRT)-device configured to:
transfer the magnet from an operating state to a non-operating state in a ramp-down mode;
subsequently transfer the magnet from the non-operating state to the operating state in a ramp-up mode;

observe a reference parameter, wherein the reference parameter comprises a current;
set a target value for the reference parameter, wherein the current is calibrated during a previous ramp-up mode, a previous ramp-down mode, or a combination thereof;
compare the observed reference parameter to the target value; and
finish the ramp-up mode when the reference parameter reaches a target value.

\* \* \* \* \*